United States Patent
Yang et al.

(10) Patent No.: US 10,332,830 B2
(45) Date of Patent: Jun. 25, 2019

(54) SEMICONDUCTOR PACKAGE ASSEMBLY

(71) Applicant: MediaTek Inc., Hsin-Chu (TW)

(72) Inventors: Ming-Tzong Yang, Baoshan Township, Hsinchu County (TW); Wei-Che Huang, Zhudong Township, Hsinchu County (TW); Tzu-Hung Lin, Zhubei (TW)

(73) Assignee: MEDIATEK INC., Hsin-Chu (TW)

( * ) Notice: Subject to any disclaimer, the term of this patent is extended or adjusted under 35 U.S.C. 154(b) by 44 days.

(21) Appl. No.: 15/592,488

(22) Filed: May 11, 2017

(65) Prior Publication Data
US 2017/0250165 A1    Aug. 31, 2017

Related U.S. Application Data

(63) Continuation of application No. 14/741,820, filed on Jun. 17, 205, now Pat. No. 9,679,842.

(Continued)

(51) Int. Cl.
*H01L 23/48* (2006.01)
*H01L 23/522* (2006.01)
(Continued)

(52) U.S. Cl.
CPC ...... *H01L 23/5226* (2013.01); *H01L 23/3171* (2013.01); *H01L 23/49827* (2013.01);
(Continued)

(58) Field of Classification Search
CPC ............. H01L 23/5226; H01L 23/5389; H01L 23/492; H01L 23/49527; H01L 23/3171;
(Continued)

(56) References Cited

U.S. PATENT DOCUMENTS

| 8,138,017 B2 | 3/2012 | Chin | |
| 8,446,017 B2 * | 5/2013 | Paek | ...................... H01L 24/19 257/777 |

(Continued)

FOREIGN PATENT DOCUMENTS

| CN | 102024766 A | 4/2011 |
| CN | 103383923 A | 11/2013 |

(Continued)

*Primary Examiner* — (Vikki) Hoa B Trinh
(74) *Attorney, Agent, or Firm* — McClure, Qualey & Rodack, LLP

(57) ABSTRACT

A semiconductor package assembly having a first semiconductor package, with a first redistribution layer (RDL) structure, a first semiconductor die having through silicon via (TSV) interconnects formed passing therethrough coupled to the first RDL structure, and a second semiconductor package stacked on the first semiconductor package with a second redistribution layer (RDL) structure. The assembly further includes a second semiconductor die without through silicon via (TSV) interconnects formed passing therethrough, coupled to the second RDL structure, and a third semiconductor package stacked on the second semiconductor package, having a third redistribution layer (RDL) structure, a third semiconductor die without through silicon via (TSV) interconnects formed passing therethrough coupled to the third RDL structure. the third semiconductor package is coupled to the second RDL structure by second vias passing through a second molding compound between the third semiconductor package and the second RDL structure.

18 Claims, 4 Drawing Sheets

Related U.S. Application Data

(60) Provisional application No. 62/058,163, filed on Oct. 1, 2014.

(51) Int. Cl.
*H01L 23/31* (2006.01)
*H01L 23/538* (2006.01)
*H01L 23/00* (2006.01)
*H01L 25/10* (2006.01)
*H01L 23/498* (2006.01)

(52) U.S. Cl.
CPC .......... *H01L 23/5389* (2013.01); *H01L 24/19* (2013.01); *H01L 24/24* (2013.01); *H01L 24/25* (2013.01); *H01L 25/105* (2013.01); *H01L 23/49816* (2013.01); *H01L 2224/12105* (2013.01); *H01L 2224/13025* (2013.01); *H01L 2224/16145* (2013.01); *H01L 2224/24137* (2013.01); *H01L 2224/24146* (2013.01); *H01L 2224/24226* (2013.01); *H01L 2224/25171* (2013.01); *H01L 2224/73209* (2013.01); *H01L 2224/73253* (2013.01); *H01L 2225/06513* (2013.01); *H01L 2225/06541* (2013.01); *H01L 2225/1035* (2013.01); *H01L 2225/1041* (2013.01); *H01L 2225/1058* (2013.01); *H01L 2924/1431* (2013.01); *H01L 2924/1432* (2013.01); *H01L 2924/1436* (2013.01); *H01L 2924/18161* (2013.01); *H01L 2924/18162* (2013.01)

(58) Field of Classification Search
CPC ....... H01L 23/4952; H01L 2224/12105; H01L 2224/16145; H01L 2224/24137; H01L 2224/73253; H01L 2224/13025; H01L 2224/73209; H01L 24/19; H01L 24/10–25; H01L 2224/82–86; H01L 2224/63–67; H01L 2224/71–72; H01L 2224/90
See application file for complete search history.

(56) References Cited

U.S. PATENT DOCUMENTS

| | | |
|---|---|---|
| 2010/0109138 A1 | 5/2010 | Cho |
| 2010/0155920 A1 | 6/2010 | Lee |
| 2011/0291283 A1* | 12/2011 | Chi ................. H01L 23/3128 257/773 |
| 2012/0056316 A1 | 3/2012 | Pagaila et al. |
| 2012/0211885 A1* | 8/2012 | Choi ................ H01L 23/3128 257/737 |
| 2012/0326324 A1* | 12/2012 | Lee .................. H01L 21/561 257/774 |
| 2013/0234322 A1 | 9/2013 | Pendse |
| 2014/0091471 A1* | 4/2014 | Chen .................. H01L 24/19 257/770 |
| 2014/0124949 A1* | 5/2014 | Paek ................ H01L 23/49811 257/774 |
| 2015/0069623 A1* | 3/2015 | Tsai .................. H01L 21/563 257/774 |
| 2015/0187743 A1* | 7/2015 | Yu .................... H01L 25/50 257/741 |
| 2015/0279815 A1* | 10/2015 | Do .................. H01L 25/0655 257/737 |
| 2015/0287700 A1* | 10/2015 | Yu .................... H01L 23/5386 257/774 |
| 2015/0325556 A1* | 11/2015 | Lai .................. H01L 23/49811 257/777 |
| 2015/0348912 A1* | 12/2015 | Su .................... H01L 21/4842 257/666 |
| 2016/0020175 A1* | 1/2016 | Kuo .................. H01L 25/065 257/783 |
| 2016/0049363 A1* | 2/2016 | Cheng ................ H01L 23/28 257/774 |
| 2017/0263470 A1* | 9/2017 | Lin .................... H01L 24/19 |

FOREIGN PATENT DOCUMENTS

| | | |
|---|---|---|
| KR | 1020130110871 | 10/2013 |
| KR | 1020130132161 | 12/2013 |
| KR | 10-1519307 | 5/2015 |
| KR | 10-1519307 B1 | 5/2015 |
| WO | 2013/176426 A1 | 11/2013 |

* cited by examiner

SEMICONDUCTOR PACKAGE ASSEMBLY

CROSS REFERENCE TO RELATED APPLICATIONS

This application is the Continuation of pending U.S. patent application Ser. No. 14/741,820, filed on Jun. 17, 2015, which claims the benefit of U.S. Provisional Application No. 62/058,163 filed on Oct. 1, 2014, the entireties of which are incorporated by reference herein.

BACKGROUND OF THE INVENTION

Field of the Invention

The present invention relates to a semiconductor package assembly, and in particular to a hybrid dynamic random access memory (DRAM) package assembly.

Description of the Related Art

Package-on-package (PoP) package assembly is an integrated circuit packaging method to combine vertically discrete system-on-chip (SOC) and memory packages. Two or more packages are installed atop each other, i.e. stacked, with a standard interface to route signals between them. This allows higher component density in devices, such as mobile phones, personal digital assistants (PDAs), and digital cameras.

For memory applications with increased levels of integration as well as improved performance, bandwidth, latency, power, weight, and form factor, the signal pad to ground pad ratio becomes important in improving the coupling effect.

Thus, a novel semiconductor package assembly is desirable.

BRIEF SUMMARY OF THE INVENTION

A semiconductor package assembly is provided. An exemplary embodiment of a semiconductor package assembly includes a first semiconductor package, with a first redistribution layer (RDL) structure, a first semiconductor die having through silicon via (TSV) interconnects formed passing therethrough coupled to the first RDL structure, and a second semiconductor package stacked on the first semiconductor package with a second redistribution layer (RDL) structure. The assembly further includes a second semiconductor die without through silicon via (TSV) interconnects formed passing therethrough, coupled to the second RDL structure, and a third semiconductor package stacked on the second semiconductor package, having a third redistribution layer (RDL) structure, a third semiconductor die without through silicon via (TSV) interconnects formed passing therethrough coupled to the third RDL structure. the third semiconductor package is coupled to the second RDL structure by second vias passing through a second molding compound between the third semiconductor package and the second RDL structure.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
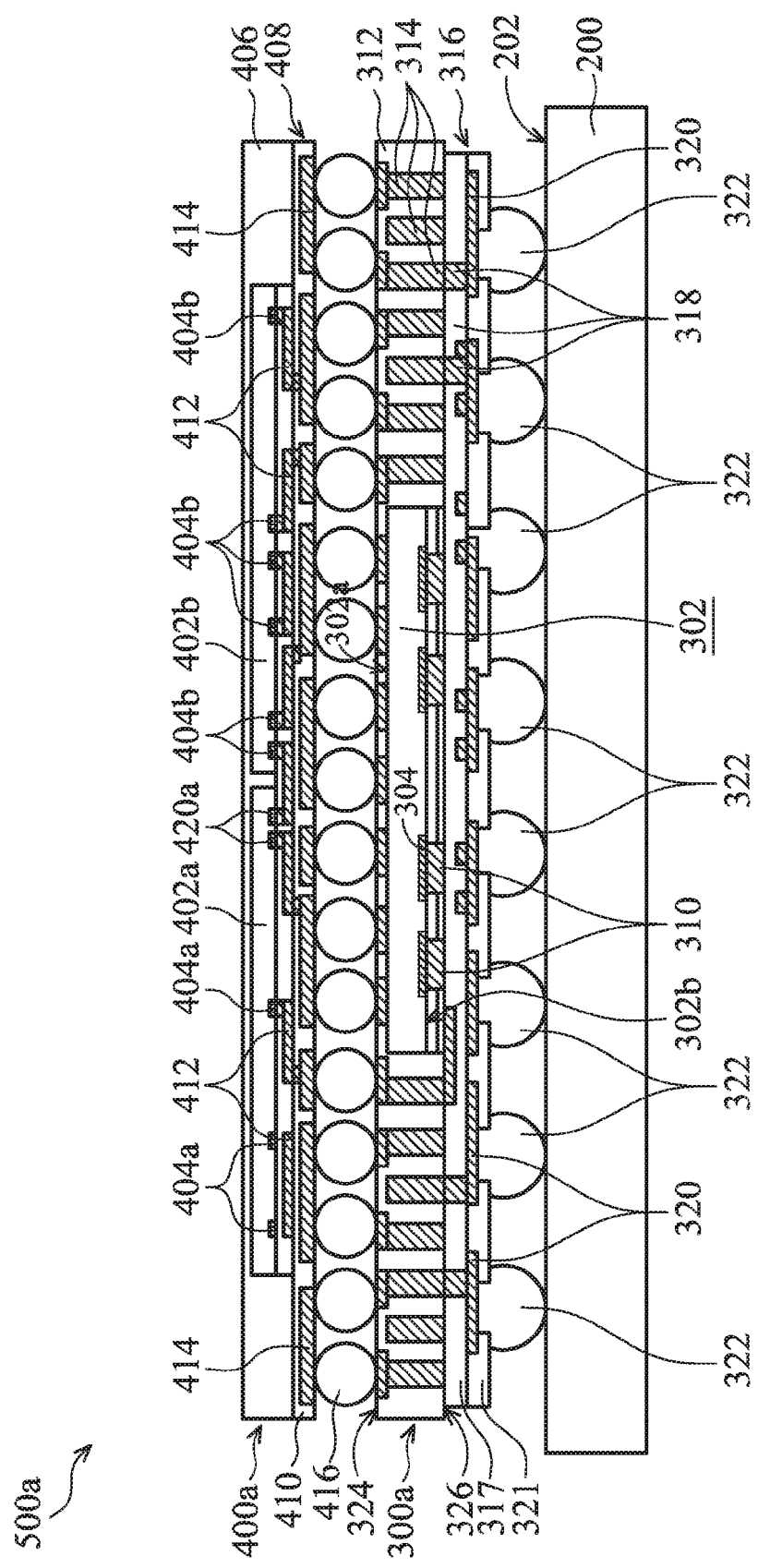
FIG. 1 is a cross-sectional view of a semiconductor package assembly including a system-on-chip (SOC) package and a dynamic random access memory (DRAM) package stacked thereon in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a cross-sectional view of a semiconductor package assembly including a system-on-chip (SOC) package 300a and a dynamic random access memory (DRAM) package 400a stacked thereon in accordance with some embodiments of the disclosure. In some embodiments, the semiconductor package assembly 500a is a package-on-package (POP) semiconductor package assembly. The semiconductor package assembly 500a includes at least two vertically stacked wafer-level semiconductor packages mounted on a base 200. In this embodiment, the vertically stacked wafer-level semiconductor packages include a pure system-on-chip (SOC) package 300a and a dynamic random access memory (DRAM) package 400a vertically stacked thereon.

As shown in FIG. 1, the base 200, for example a printed circuit board (PCB), may be formed of polypropylene (PP). It should also be noted that the base 200 can be a single layer or a multilayer structure. A plurality of pads (not shown) and/or conductive traces (not shown) is disposed on a die-attach surface 202 of the base 200. In one embodiment, the conductive traces may comprise signal trace segments or ground trace segments, which are used for the input/output (I/O) connections of the SOC package 300a and the DRAM package 400a. Also, the SOC package 300a is mounted directly on the conductive traces. In some other embodiments, the pads are disposed on the die-attach surface 202, connected to different terminals of the conductive traces. The pads are used for the SOC package 300a mounted directly thereon.

As shown in FIG. 1, the SOC package 300a is mounted on the die-attach surface 202 of the base 200 by a bonding process. The SOC package 300a is mounted on the base 200 through the conductive structures 322. The SOC package 300a is a semiconductor package including a system on chip (SOC) die 302 and a redistribution layer (RDL) structure 316. The pure SOC package 300a is defined that the SOC package 300a does not include any DRAM die integrated therein. The SOC die 302, for example, may include a logic die including a central processing unit (CPU), a graphic processing unit (GPU), a dynamic random access memory (DRAM) controller or any combination thereof.

As shown in FIG. 1, the SOC die 302 has a back surface 302a and a front surface 302b. The SOC die 302 is fabricated by a flip-chip technology. The back surface 302a of the SOC die 302 is close to or aligned with the top surface 324 of the SOC package 300a. Pads 304 of the SOC die 302 are disposed on the front surface 302b to be electrically connected to the circuitry (not shown) of the SOC die 302. In some embodiments, the pads 304 belong to the uppermost metal layer of the interconnection structure (not shown) of the SOC die 302. The pads 304 of the SOC die 302 are in contact with the corresponding vias 310. It should be noted that the number of SOC dies 302 integrated in the semiconductor package assembly 500a is not limited to the disclosed embodiment.

As shown in FIG. 1, the SOC package 300a further includes a molding compound 312 covering and surrounding the SOC die 302. The molding compound 312 is in contact with the SOC die 302. The molded compound 312 may also cover the top surface 302b of the SOC die 302. In some embodiments, the molded compound 312 may be formed of a nonconductive material, such as an epoxy, a resin, a moldable polymer, or the like. The molding compound 312 may be applied while substantially liquid, and then may be cured through a chemical reaction, such as in an epoxy or resin. In some other embodiments, the molding compound 312 may be an ultraviolet (UV) or thermally cured polymer applied as a gel or malleable solid capable of being disposed around the SOC die 302, and then may be cured through a UV or thermally curing process. The molding compound 312 may be cured with a mold (not shown).

As shown in FIG. 1, the SOC package 300a further includes a redistribution layer (RDL) structure 316 is disposed on the SOC die 302. The SOC die 302 of the SOC package 300a is connected to the redistribution layer (RDL) structure 316 through vias (such as vias 310). In this embodiment, the SOC die 302 is coupled to the RDL 316 without going through additional memory dies (such as DRAM dies). The RDL structure 316 may be in contact with the molding compound 312 and the vias 310. In some embodiments, the RDL structure 316 may have one or more conductive traces 318 disposed in one or more intermetal dielectric (IMD) layers 317. The conductive traces 318 are electrically connected to corresponding RDL contact pads 320. The RDL contact pads 320 are exposed to openings of the solder mask layer 321. However, it should be noted that the number of conductive traces 318, the number of IMD layers 317 and the number of RDL contact pads 320 shown in FIG. 1 is only an example and is not a limitation to the present invention.

As shown in FIG. 1, the SOC package 300a further includes conductive structures 322 disposed on a surface of the RDL structure 316 away from the SOC die 302. The conductive structures 322 are coupled to the conductive traces 318 through the RDL contact pads 320. In some embodiments, the conductive structures 322 may comprise a conductive bump structure such as a copper bump or a solder bump structure, a conductive pillar structure, a conductive wire structure, or a conductive paste structure.

As shown in FIG. 1, the conductive traces 318 may be designed to be fan out from one or more of the pads 304 and 306 of the SOC die 302 to provide electrical connections between the SOC die 302 and the RDL contact pads 320. Therefore, the RDL contact pads 320 may have a larger bond pitch than the pads 304 and 306 of the SOC die 302, and which may be suitable for a ball grid array or another package mounting system.

As shown in FIG. 1, the DRAM package 400a is vertically stacked on the SOC package 300a by a bonding process. In one embodiment, the DRAM package 400a is a Wide I/O DRAM (Wide I/O DRAM) package following the pin assignment rule (such as JEDEC Wide I/O Memory specification). In this embodiment, the DRAM package 400a includes a redistribution layer (RDL) structure 408 and at least one DRAM die, for example, two Wide I/O DRAM dies 402a and 402b, embedded therein. The DRAM dies 402a and 402b of the DRAM package 400a are fabricated by a flip-chip technology. Also, the DRAM dies 402a and 402b are fabricated without any TSV interconnects formed passing therethrough. In this embodiment, there are two Wide I/O DRAM dies 402a and 402b mounted up-side-down on the RDL structure 408. The Wide I/O DRAM dies 402a and 402b are arranged side by side. However, the number and the arrangement of stacked Wide I/O DRAM dies are not limited to the disclosed embodiment. The Wide I/O DRAM dies 402a and 402b include pads 404a and 404b on top surfaces of the Wide I/O DRAM dies 402a and 402b, respectively. The pads 404a and 404b may be arranged as an array to transmit input/output (I/O), ground or power signals from the Wide I/O DRAM dies 402a and 402b to the RDL structure 408. It should be noted that the number of pads 404a and 404b in the array is defined by design for the Wide I/O DRAM die 402a and 402b and the scope of the disclosure is not limited.

As shown in FIG. 1, the DRAM package 400a further includes a molding compound 406 disposed on RDL structure 408. The molding compound 406 surrounds the Wide I/O DRAM dies 402a and 402b, and filling any gaps around the Wide I/O DRAM dies 402a and 402b. The molding compound 406 is in contact with the Wide I/O DRAM dies 402a and 402b and the RDL structure 408.

As shown in FIG. 1, the RDL structure 408 of the DRAM package 400a is disposed on the Wide I/O DRAM dies 402a and 402. The Wide I/O DRAM dies 402a and 402b are coupled to the RDL structure 408 through the pads 404a and 404b, respectively. The RDL structure 316 may be in contact with the molding compound 406 and the pads 404a and 404b of the Wide I/O DRAM dies 402a and 402b. In some embodiments, the RDL structure 408 may have one or more conductive traces 412 disposed in one or more intermetal dielectric (IMD) layers 410. The conductive traces 412 are electrically connected to corresponding RDL contact pads 414. The RDL contact pads 412 are exposed to a surface of the RDL structure 408 away from the Wide I/O DRAM dies 402a and 402b. However, it should be noted that the number of conductive traces 412, the number of IMD layers 410 and the number of RDL contact pads 414 shown in FIG. 1 is only an example and is not a limitation to the present invention.

As shown in FIG. 1, the conductive traces 412 of the DRAM package 400a is interconnected with the conductive traces 318 of the RDL structure 316 of the pure SOC package 300a via a plurality of conductive structures 416 disposed on the RDL contact pads 414 of the RDL structure 408. In some embodiments, the conductive structures 416 may comprise a conductive bump structure such as a copper bump or a solder bump structure, a conductive pillar structure, a conductive wire structure, or a conductive paste structure. In some embodiments, the conductive structures 416 of the DRAM package 400a are coupled to the RDL structure 316 of the SOC package 300a by the vias 314 passing through the molding compound 312 between the RDL structure 408 of the DRAM package 400a and the RDL structure 316 of the SOC package 300a. The SOC die 302 is surrounded by the vias 314.

Figure 2:
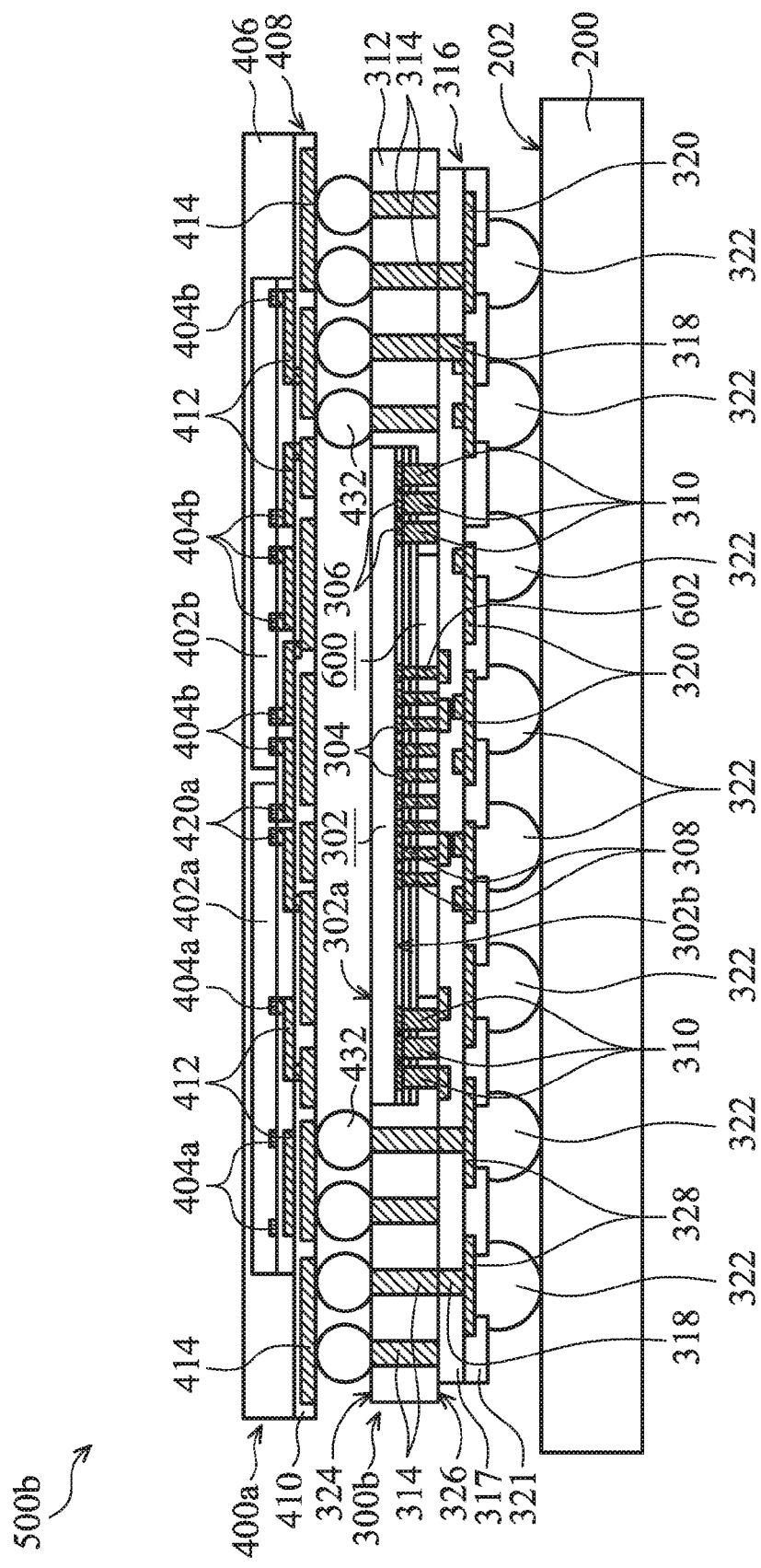
FIG. 2 is a cross-sectional view of a semiconductor package assembly including a hybrid system-on-chip (SOC) package and a dynamic random access memory (DRAM) package stacked thereon in accordance with some embodiments of the disclosure.

FIG. 2 is a cross-sectional view of a semiconductor package assembly 500b including a system-on-chip (SOC) package 300b and a hybrid dynamic random access memory (DRAM) package 400a stacked thereon in accordance with some embodiments of the disclosure. Elements of the embodiments hereinafter, that are the same or similar as those previously described with reference to FIG. 1, are not repeated for brevity. The differences between the semiconductor package assembly 500a and the semiconductor package assembly 500b is that the semiconductor package assembly 500b includes a hybrid system-on-chip (SOC) package 300b and a pure DRAM package 400a vertically stacked thereon.

As shown in FIG. 2, the hybrid SOC package 300b is mounted on the die-attach surface 202 of the base 200 by a bonding process. The hybrid SOC package 300b is mounted on the base 200 through the conductive structures 322. The hybrid SOC package 300b is a three-dimensional (3D) semiconductor package including the system on chip (SOC) die 302, a dynamic random access memory (DRAM) die 600 and the RDL structure 316. The dynamic random access memory (DRAM) die 600 may include a Wide I/O DRAM die, vertically stacked on the SOC die 302. In this embodiment, the DRAM die 600 of the hybrid SOC package 300b is fabricated by the through silicon via (TSV) technology. The SOC die 302 and the DRAM die 600 of the hybrid SOC package 300b are connected to each other and/or to the redistribution layer (RDL) structure 316 by vias (such as vias 308, 310). It should be noted that the number of SOC dies 302 and the number of DRAM dies 600 are not limited to the disclosed embodiment.

As shown in FIG. 2, the DRAM die 600 is stacked on the front surface 302b of the SOC die 302. The DRAM die 600 is coupled to the pads 304 of the SOC die 302 through the vias 308 disposed on the SOC die 302. The DRAM die 600 may include TSV interconnects 602 formed through the DRAM die 600. The TSV interconnects 602 arranged as an array are used to transmit input/output (I/O), ground or power signals from the DRAM die 600 to the SOC die 302 and/or the base 200. The TSV interconnects 602 may be designed to follow the pin assignment rule (such as JEDEC Wide I/O Memory specification). It should be noted that the number of TSV interconnects in the array is defined by design for the DRAM die 600 and the SOC die 302 mounted thereon and the scope of the disclosure is not limited. The vias 308 are coupled to the corresponding TSV interconnects 602.

As shown in FIG. 2, the hybrid SOC package 300b further includes the molding compound 312 surrounding the SOC die 302 and the DRAM die 600, and filling any gaps around the SOC die 302 and the DRAM die 600. The molding compound 312 is in contact with the SOC die 302 and the DRAM die 600.

As shown in FIG. 2, the redistribution layer (RDL) structure 316 of the hybrid SOC package 300b is disposed on the DRAM die 600 and the SOC die 302, so that the DRAM die 600 is between the SOC die 302 and the RDL structure 316. The RDL structure 316 may be in contact with the molding compound 312 and the TSV interconnects 602 of the DRAM die 600.

As shown in FIG. 2, the conductive structures 322 of the hybrid SOC package 300b is disposed on the surface of the RDL structure 316 away from the DRAM die 600 and the SOC die 302.

As shown in FIG. 2, the DRAM die 600 uses the TSV interconnects 602 respectively connecting the pads 304 of the SOC die 302 to the conductive traces 318 of the RDL structure 316 by the vias 308. Also, the pads 306 of the SOC die 302 are coupled to the conductive traces 318 of the RDL structure 316 by the vias 310 passing through the molding compound 312 between the SOC die 302 and the RDL structure 316. The DRAM die 600 is surrounded by the vias 310.

As shown in FIG. 2, the conductive traces 318 may be designed to be fan out from one or more of the pads 304 and 306 of the SOC die 302 and TSV interconnects 602 of DRAM die 600 to provide electrical connections between the SOC die 302, DRAM die 600 and the RDL contact pads 320. Therefore, the RDL contact pads 320 may have a larger bond pitch than the pads 304 and 306 of the SOC die 302 and TSV interconnects 602 of DRAM die 600, and which may be suitable for a ball grid array or another package mounting system.

Figure 3:
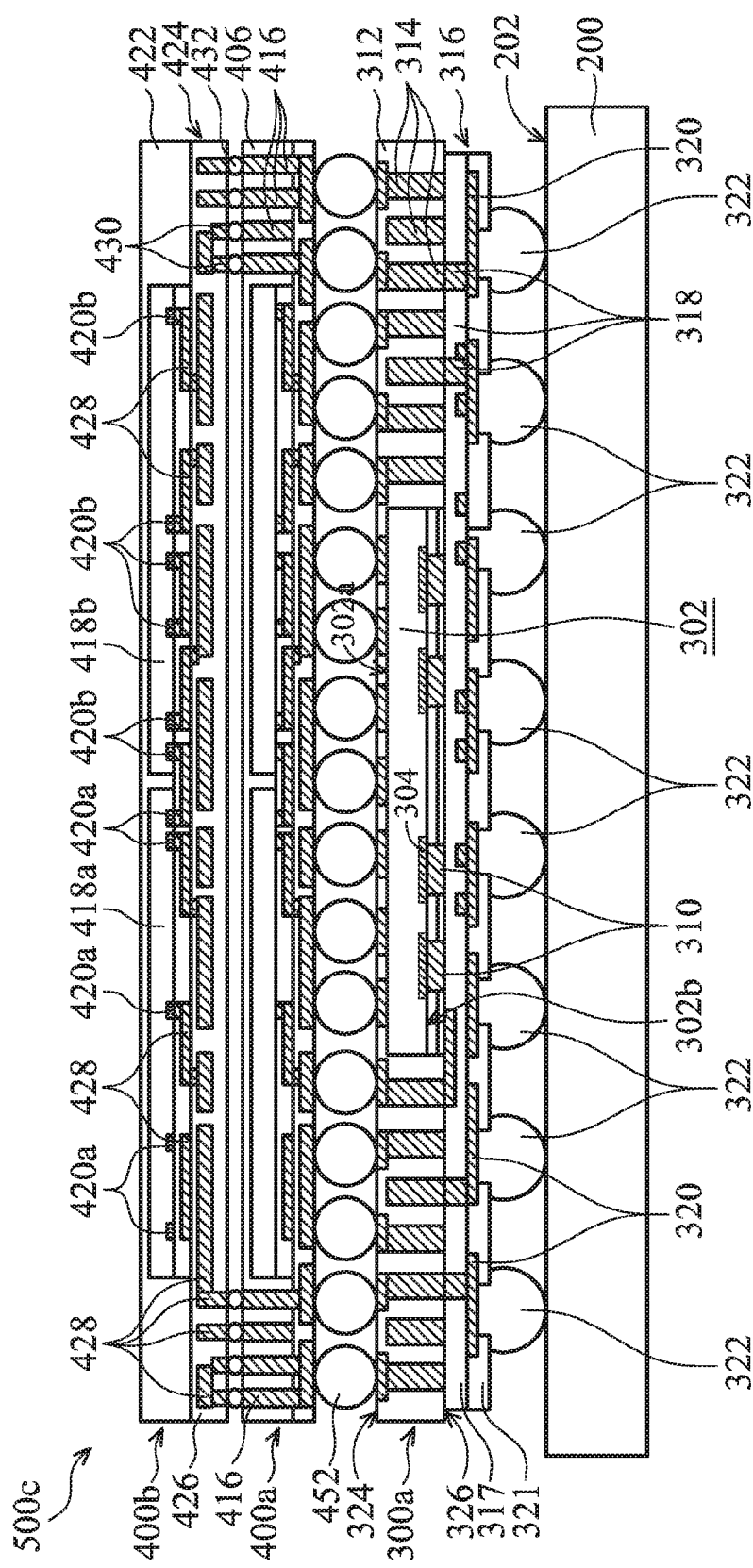
FIG. 3 is a cross-sectional view of a semiconductor package assembly including a system-on-chip (SOC) package and two dynamic random access memory (DRAM) packages stacked thereon in accordance with some embodiments of the disclosure.

In some embodiments, the semiconductor package assembly includes a system-on-chip (SOC) package and multi dynamic random access memory (DRAM) packages stacked thereon. FIG. 3 is a cross-sectional view of a semiconductor package assembly 500c including a system-on-chip (SOC) package and two dynamic random access memory (DRAM) packages stacked thereon in accordance with some embodiments of the disclosure. Elements of the embodiments hereinafter, that are the same or similar as those previously described with reference to FIGS. 1 and 2, are not repeated for brevity. The differences between the semiconductor package assembly 500a and the semiconductor package assembly 500c is that the semiconductor package assembly 500c includes a pure system-on-chip (SOC) package 300a and two pure DRAM packages 400a and 400b vertically stacked thereon.

As shown in FIG. 3, the DRAM package 400a is vertically stacked on the SOC package 300a, and the DRAM package 400 is vertically stacked on the DRAM package 400a by bonding processes. In one embodiment, the DRAM packages 400a and 400b are both Wide I/O DRAM (Wide I/O DRAM) packages following the pin assignment rule (such as JEDEC Wide I/O Memory specification). In this embodiment, the DRAM package 400b has an arrangement that is similar to or the same as the DRAM package 400a. The DRAM dies 402a and 402b of the DRAM package 400a are fabricated by a flip-chip technology. Also, the DRAM dies 418a and 418b of the DRAM package 400b are fabricated without any TSV interconnects formed passing therethrough. In this embodiment, there are two Wide I/O DRAM dies 418a and 418b mounted up-side-down on an RDL structure 424 through pads 420a and 420b of the DRAM package 400b. The Wide I/O DRAM dies 402a and 402b are arranged side by side. However, the number and the arrangement of stacked Wide I/O DRAM dies of the DRAM package 400b are not limited to the disclosed embodiment. It should be noted that the number of pads 420a and 420b arranged in an array is defined by design for the Wide I/O DRAM die 418a and 418b of the DRAM package 400b and the scope of the disclosure is not limited.

As shown in FIG. 3, conductive traces 428 of RDL structure 424 of the pure DRAM package 400b is interconnected with the RDL structure 408 of the pure DRAM package 400a via a plurality of conductive structures 432 disposed on RDL contact pads 430 of the RDL structure 424. The conductive structures 432 are disposed in one or more intermetal dielectric (IMD) layers 410. The conductive traces 428 are electrically connected to corresponding RDL contact pads 430. The RDL contact pads 430 are exposed to a surface of the RDL structure 424 away from the Wide I/O DRAM dies 418a and 418b. In some embodiments, the conductive structures 432 of the DRAM package 400b are coupled to the RDL structure 408 of the pure DRAM package 400a by the vias 416 passing through the molding compound 312 between the RDL structure 408 of the DRAM package 400a and the RDL structure 406 of the DRAM package 400a. The DRAM dies 402a and 402b are surrounded by the vias 416. In some embodiments, the conductive structures 432 of the pure DRAM package 400b may comprise a conductive bump structure with a diameter (such as a width) less than a diameter of the conductive structures 416 of the pure DRAM package 400a. For example, the diameter of the conductive structures 432 may be arranged comparable to the diameter of the vias 416.

Figure 4:
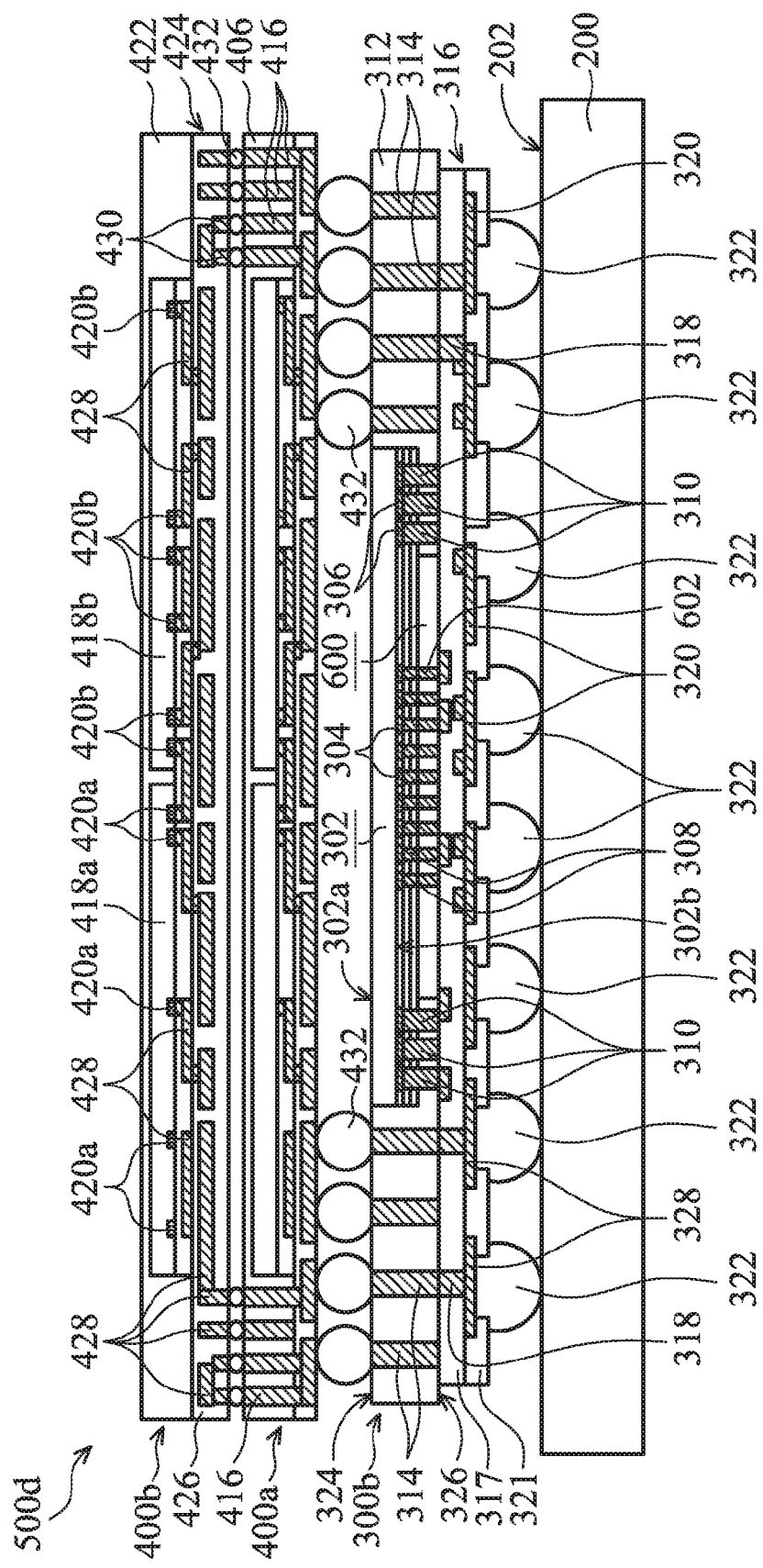
FIG. 4 is a cross-sectional view of a semiconductor package assembly including a hybrid system-on-chip (SOC) package and two dynamic random access memory (DRAM) packages stacked thereon in accordance with some embodiments of the disclosure.

FIG. 4 is a cross-sectional view of a semiconductor package assembly including a hybrid system-on-chip (SOC) package and two dynamic random access memory (DRAM) packages stacked thereon in accordance with some embodiments of the disclosure. The differences between the semiconductor package assembly 500b and the semiconductor package assembly 500d is that the semiconductor package assembly 500d includes a hybrid system-on-chip (SOC) package 300b and two pure DRAM packages 400a and 400b vertically stacked thereon. The arrangements of the hybrid SOC package 300b and the two pure DRAM packages 400a and 400b, that are the same or similar as those previously described with reference to FIGS. 1-3, are not repeated for brevity.

Embodiments provide semiconductor package assemblies 500a-500d. The semiconductor package assemblies 500a and 500c provide at least one Wide I/O DRAM package (the DRAM packages 400a and 400b) stacked on a pure SOC package. The semiconductor package assemblies 500b and 500d provide at least one Wide I/O DRAM package (the DRAM packages 400a and 400b) stacked on a SOC/Wide I/O DRAM hybrid package. The Wide I/O DRAM package of the semiconductor package assemblies 500a-500d are fabricated by a flip-chip technology without any though silicon via (TSV) interconnects formed passing therethrough. Also, the semiconductor package assemblies 500b and 500d with multiple Wide I/O DRAM packages (the DRAM packages 400a and 400b) are connected to each other and/or to the SOC packages (including the pure SOC package 300a and the SOC/Wide I/O DRAM hybrid package) by through package vias (TPV) (for example, the vias 416) passing through the molding compound. The semiconductor package assemblies 500a-500d may satisfy the requirements of cost-efficiency, high bandwidth, low power, and quick transition.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package assembly, comprising:
   a first semiconductor package, comprising:
      a first redistribution layer (RDL) structure;
      a first semiconductor die having through silicon via (TSV) interconnects formed passing therethrough coupled to the first RDL structure;
   a second semiconductor package stacked on the first semiconductor package, comprising:
      a second redistribution layer (RDL) structure;
      a second semiconductor die without through silicon via (TSV) interconnects formed passing therethrough, coupled to the second RDL structure; and
   a third semiconductor package stacked on the second semiconductor package, comprising:
      a third redistribution layer (RDL) structure;
      a third semiconductor die without through silicon via (TSV) interconnects formed passing therethrough coupled to the third RDL structure;
   wherein the third semiconductor package is coupled to the second RDL structure by second vias passing through a second molding compound between the third semiconductor package and the second RDL structure.

2. The semiconductor package assembly as claimed in claim 1, wherein the first semiconductor package further comprises:
   a first molding compound surrounding the first semiconductor die, being in contact with the RDL structure and the first semiconductor die.

3. The semiconductor package assembly as claimed in claim 1, wherein the first semiconductor package further comprises:
   a fourth semiconductor die having first pads thereon; and
   third vias disposed below the first semiconductor die, coupled to the first pads, wherein the fourth semiconductor die is mounted on the first semiconductor die.

4. The semiconductor package assembly as claimed in claim 1, wherein a number of input/output (I/O) pins of the first semiconductor die is the same as a number of input/output (I/O) pins of the second semiconductor die.

5. The semiconductor package assembly as claimed in claim 3, wherein the first semiconductor die is disposed between the fourth semiconductor die and the first RDL structure.

6. The semiconductor package assembly as claimed in claim 3, wherein the first semiconductor package comprises:
   first conductive structures disposed on a surface of the first RDL structure away from the fourth semiconductor die, wherein the first conductive structures are coupled to the first RDL structure.

7. The semiconductor package assembly as claimed in claim 2, wherein the second semiconductor package is coupled to the first RDL structure by first vias passing through the first molding compound between the second semiconductor package and the first RDL structure.

8. The semiconductor package assembly as claimed in claim 3, wherein the fourth semiconductor die is surrounded by the first vias.

9. The semiconductor package assembly as claimed in claim 1, wherein the second semiconductor package is mounted on the first semiconductor package through second conductive structures disposed on a surface of the second RDL structure away from the first semiconductor die.

10. The semiconductor package assembly as claimed in claim 1, wherein the second semiconductor die is surrounded by the second vias.

11. A semiconductor package assembly, comprising:
a system-on-chip (SOC) package, comprising:
a first semiconductor die; and
a molding compound surrounding the first semiconductor die, being in contact with the first semiconductor die; and
a first memory package stacked on the SOC package, comprising:
a first memory die without through silicon via (TSV) interconnects formed passing therethrough,
wherein the SOC package comprises a first redistribution layer (RDL) structure for the first semiconductor die coupled thereto, and wherein the first memory package comprises a second redistribution layer (RDL) structure for the first memory die coupled thereto,
wherein the SOC package further comprises an additional semiconductor die coupled to the first semiconductor die,
wherein the additional semiconductor die has through silicon via (TSV) interconnects formed through the additional semiconductor die,
wherein the additional semiconductor die is disposed between the first semiconductor die and the first RDL structure.

12. The semiconductor package assembly as claimed in claim 11, further comprising:
a second memory package stacked on the first memory package, comprising:
a third redistribution layer (RDL) structure;
a second memory die without through silicon via (TSV) interconnects formed passing therethrough coupled to the third RDL structure.

13. The semiconductor package assembly as claimed in claim 11, wherein a number of input/output (I/O) pins of the first memory die is the same as a number of input/output (I/O) pins of the additional semiconductor die.

14. The semiconductor package assembly as claimed in claim 11, wherein the SOC package comprises:
first conductive structures disposed on a surface of the first RDL structure away from the first semiconductor die, coupled to the first RDL structure.

15. The semiconductor package assembly as claimed in claim 11, wherein the first memory package is coupled to the first RDL structure by first vias passing through the molding compound between the second semiconductor package and the first RDL structure.

16. The semiconductor package assembly as claimed in claim 11, wherein the first semiconductor die and the additional semiconductor die is surrounded by the first vias.

17. The semiconductor package assembly as claimed in claim 11, further comprising:
a base, wherein the SOC package and the first memory packages are mounted on the base through the first conductive structures.

18. The semiconductor package assembly as claimed in claim 11, wherein the first memory package is mounted on the SOC package through second conductive structures disposed on a surface of the second RDL structure away from the first memory die.

* * * * *